US011848357B2

(12) United States Patent
Cheng et al.

(10) Patent No.: US 11,848,357 B2
(45) Date of Patent: Dec. 19, 2023

(54) STRAINED SUPERLATTICE

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Shogo Mochizuki, Mechanicville, NY (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 17/648,687

(22) Filed: Jan. 24, 2022

(65) Prior Publication Data

US 2023/0238431 A1    Jul. 27, 2023

(51) Int. Cl.
*H01L 29/15*    (2006.01)
*H01L 21/02*    (2006.01)

(52) U.S. Cl.
CPC ...... *H01L 29/155* (2013.01); *H01L 21/02507* (2013.01); *H01L 21/02532* (2013.01)

(58) Field of Classification Search
CPC ............ H01L 29/155; H01L 21/02507; H01L 21/02532; H01L 31/035236; H01L 29/04; H01L 29/78696; H01L 29/0673; H01L 21/0245; H01L 21/823821; H01L 21/823412; H10B 41/20; H10B 43/20
See application file for complete search history.

(56) References Cited

U.S. PATENT DOCUMENTS

| 8,884,265 | B2 | 11/2014 | Bennett |
| 9,018,515 | B2 | 4/2015 | Fafard |
| 9,054,033 | B2 | 6/2015 | Park |
| 9,275,996 | B2 | 3/2016 | Mears |
| 9,640,616 | B2 | 5/2017 | Augusto |
| 9,755,073 | B1 * | 9/2017 | Cheng ............... H01L 29/42392 |

(Continued)

FOREIGN PATENT DOCUMENTS

| CN | 101371363 A | 2/2009 |
| CN | 113745346 A | 12/2021 |

(Continued)

OTHER PUBLICATIONS

Notification of Transmittal of the International Search Report and the Written Opinion of the International Searching Authority, or the Declaration, dated Apr. 11, 2023, Applicant's or agent's file reference P202004613, International application No. PCT/EP2023/050303, 11 pages.

(Continued)

*Primary Examiner* — Farun Lu
*Assistant Examiner* — Sandra Milena Rodriguez Villanu
(74) *Attorney, Agent, or Firm* — Yuanmin Cai

(57) ABSTRACT

Embodiments of present invention provide a semiconductor structure. The semiconductor structure includes a plurality of sections from a top to a bottom thereof, wherein the plurality of sections has a same chemical composition and at least two different strains. For example, in one embodiment, the plurality of sections has a same chemical composition of epitaxially grown silicon (Si) and has alternating strains between a tensile strain and a compressive strain. A method of manufacturing the semiconductor structure is also provided.

15 Claims, 12 Drawing Sheets

(56) References Cited

U.S. PATENT DOCUMENTS

| | | | |
|---|---|---|---|
| 10,490,681 B2 | 11/2019 | Masuoka | |
| 2003/0227072 A1* | 12/2003 | Forbes | H01L 27/092 257/E21.643 |
| 2004/0157353 A1 | 8/2004 | Ouyang | |
| 2005/0214964 A1 | 9/2005 | West | |
| 2014/0024202 A1 | 1/2014 | Lagally | |
| 2021/0175333 A1 | 6/2021 | Zhu | |
| 2022/0028744 A1* | 1/2022 | Chou | H01L 21/0245 |

FOREIGN PATENT DOCUMENTS

| | | |
|---|---|---|
| IN | 102162137 B | 8/2011 |
| KR | 101855023 B1 | 9/2016 |
| WO | 2011008979 A2 | 1/2011 |

OTHER PUBLICATIONS

Hutin et al., "Si CMOS Platform for Quantum Information Processing", 2016 Symposium on VLSI Technology Digest of Technical Papers, @2016 IEEE, 2 pages.

Pending U.S. Appl. No. 17/551,402, filed Dec. 15, 2021, entitled: "Forming NS Gates With Improved Mechanical Stability", 40 pages.

* cited by examiner

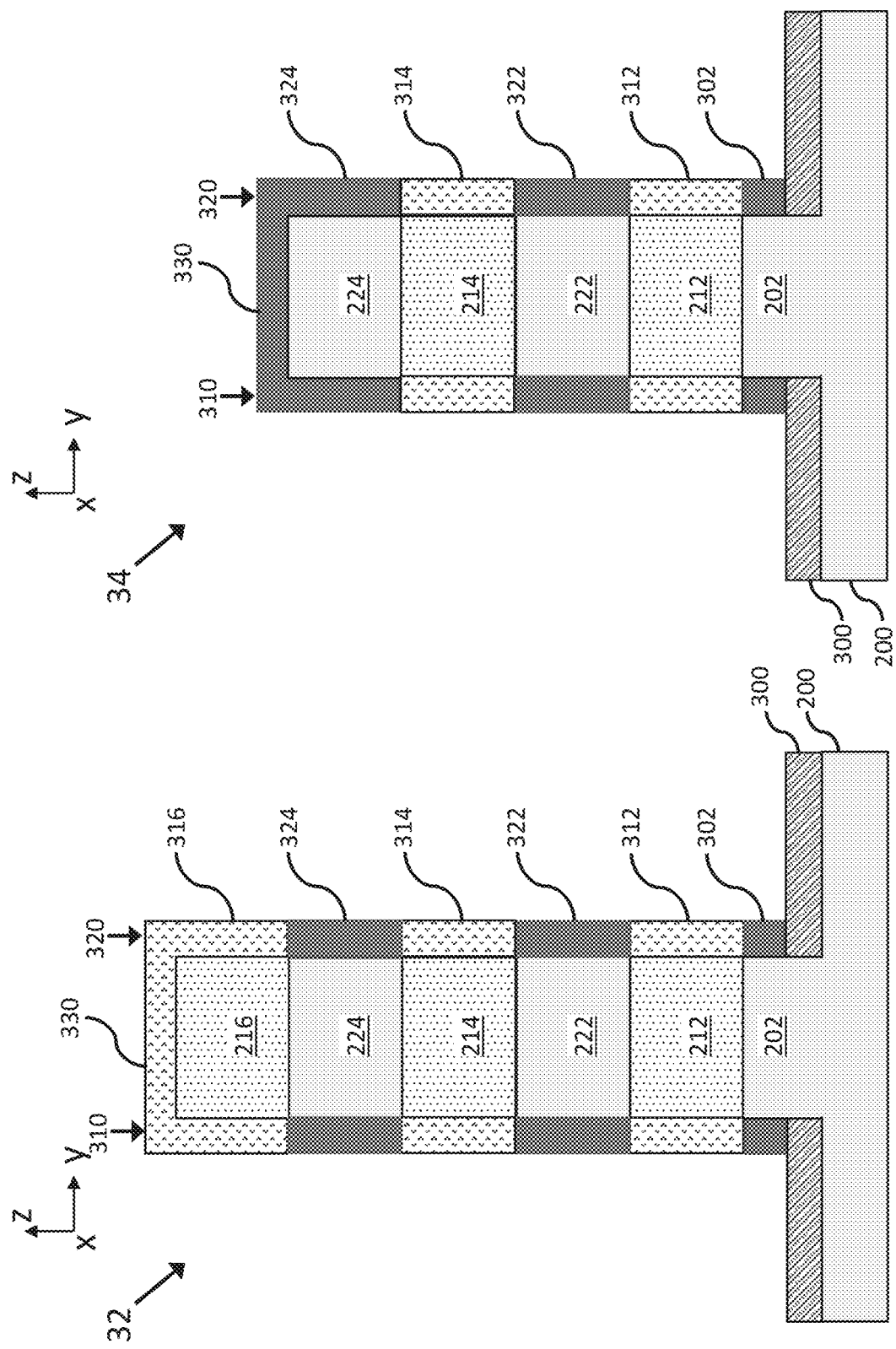

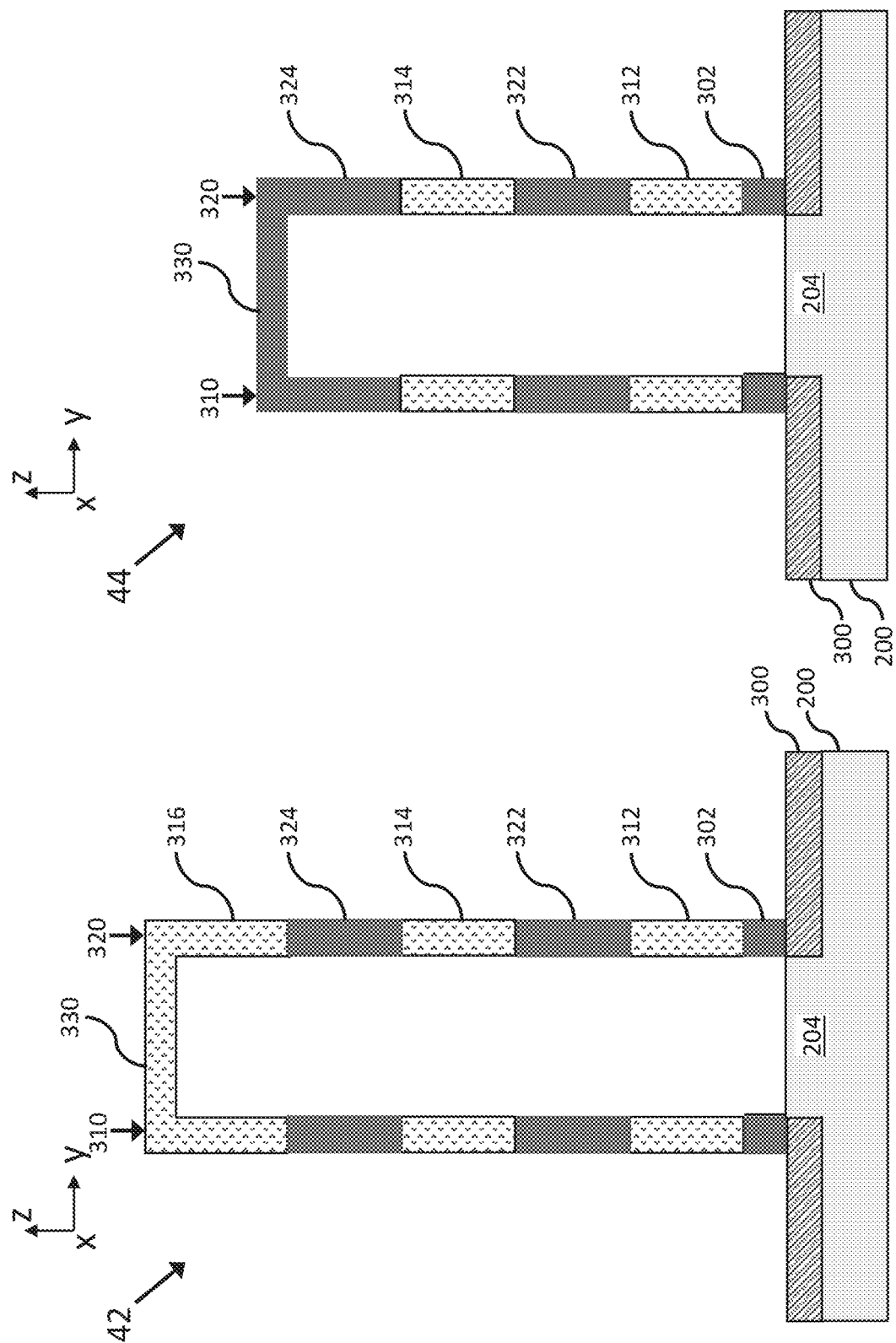

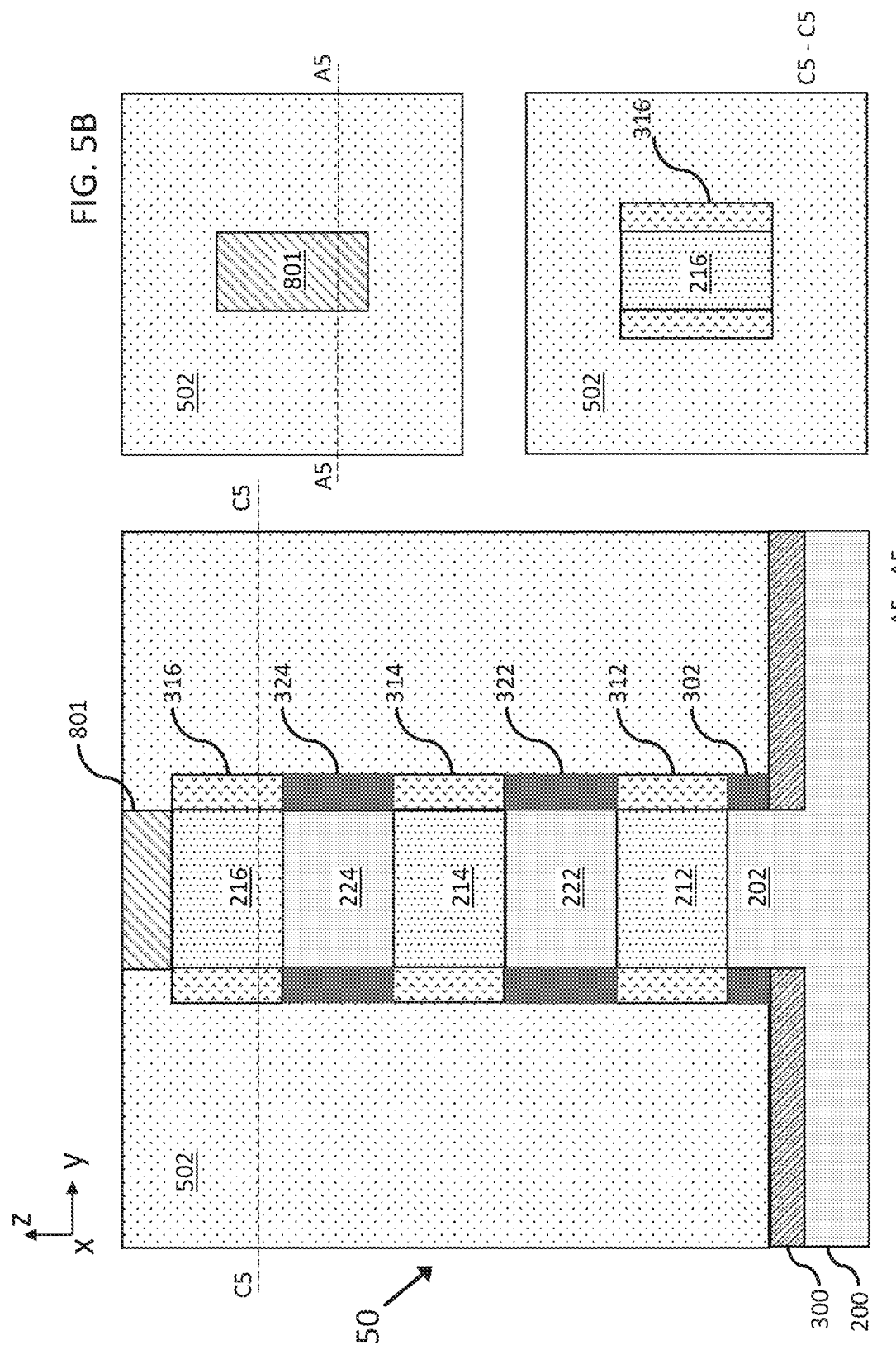

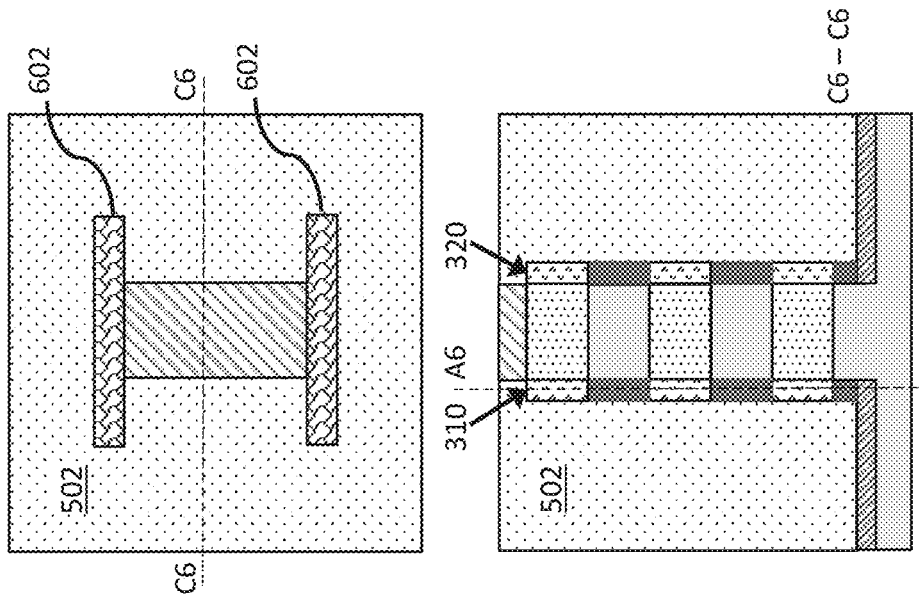
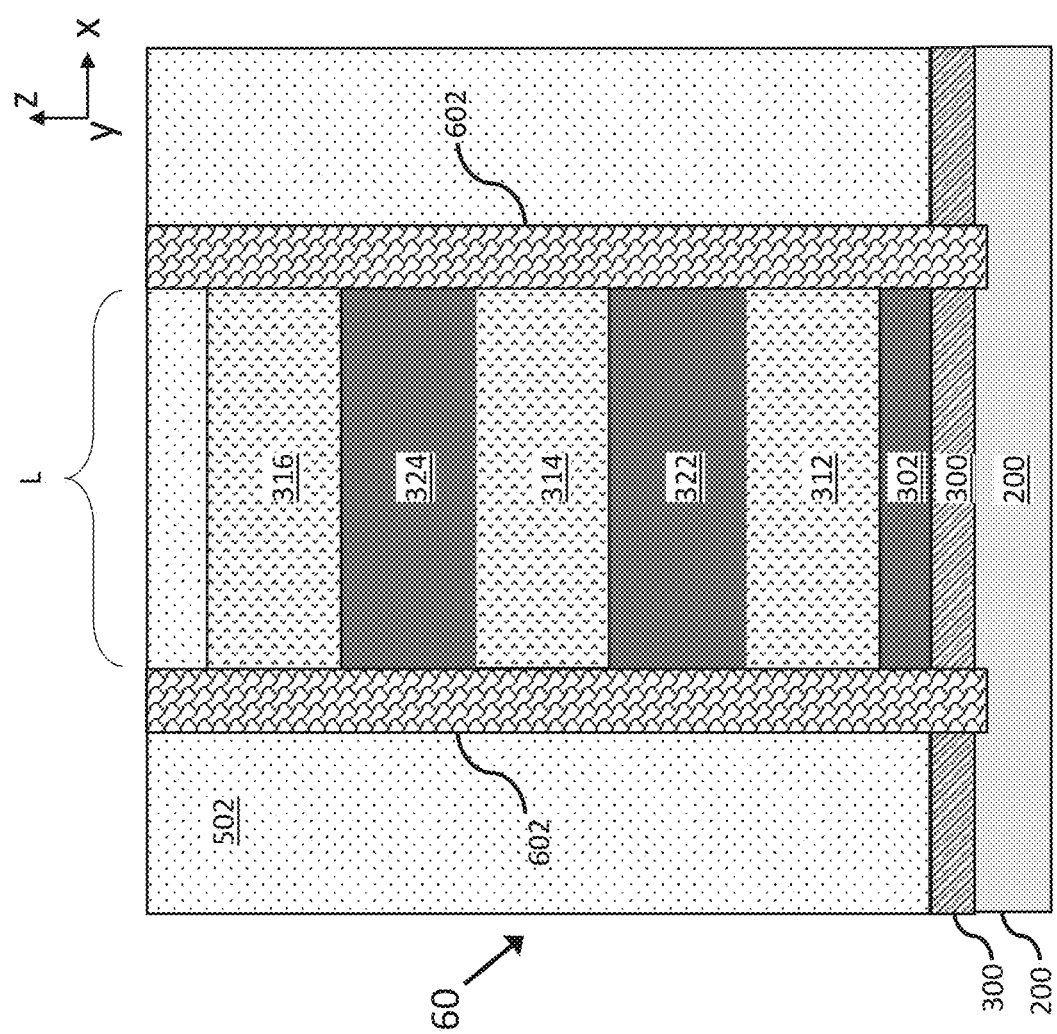

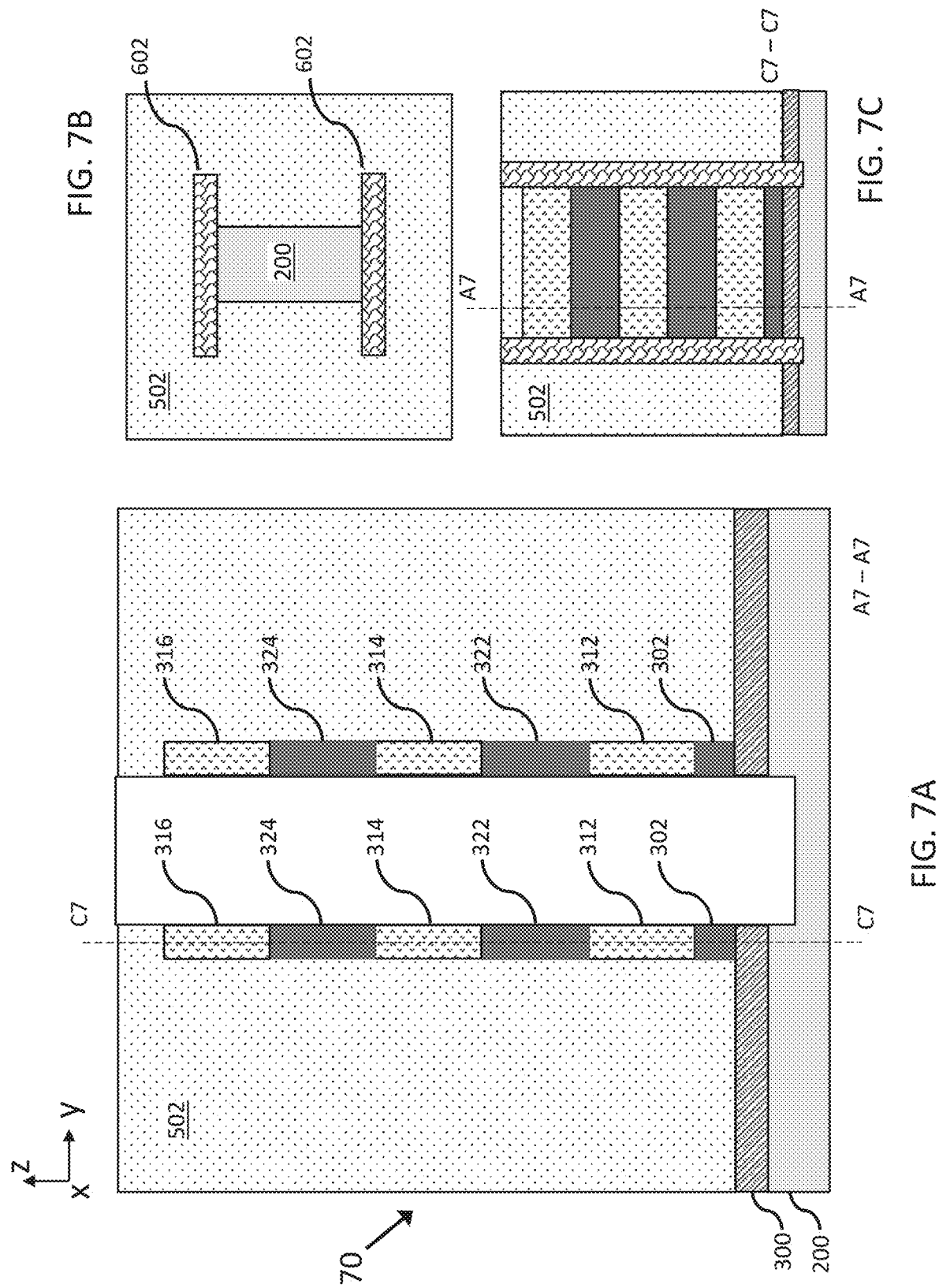

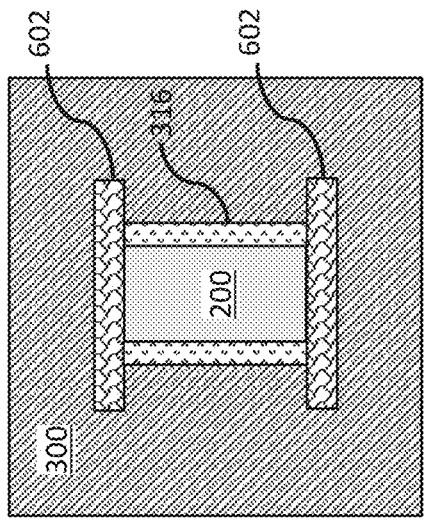
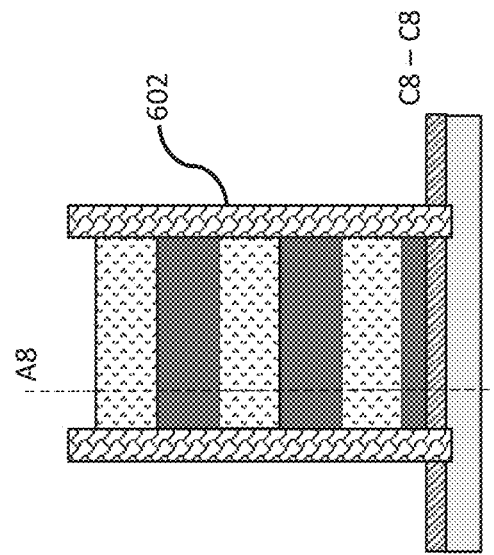
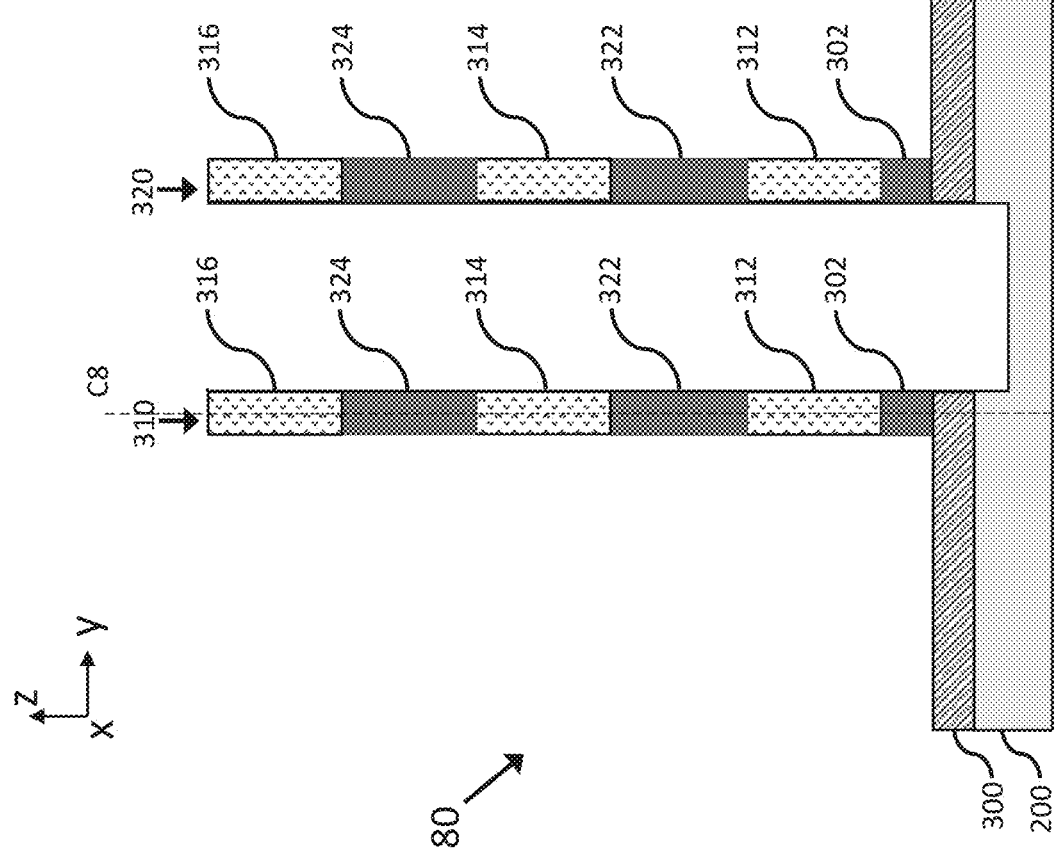

STRAINED SUPERLATTICE

FIELD OF THE INVENTION

The present application relates to manufacturing of semiconductor integrated circuits. More particularly, it relates to a strained superlattice semiconductor structure and method of manufacturing the same.

BACKGROUND

Structures and techniques have been proposed to enhance the performance of semiconductor devices, such as by enhancing the mobility of charge carriers through strain engineering. Recently, with the advancement of semiconductor manufacturing technologies, quantum well based semiconductor devices have found its way into a variety of applications such as in the fields of, for example, optics, thermoelectric, and recently emerging quantum computing. Typically, a quantum well such as a strained quantum well is formed by epitaxially growing a superlattice structure using two or more different materials with different material properties such as band gaps, thereby forming a heterogenous superlattice structure.

SUMMARY

Embodiments of present invention provide a semiconductor structure. The semiconductor structure includes a semiconductor layer having a plurality of sections from a top to a bottom thereof, wherein the plurality of sections has a same chemical composition and at least two different strains. In one embodiment, strains between two neighboring sections of the plurality of sections differ in strength, type of strain, or a combination of strength and type of strain, wherein the type of strain includes tensile strain, neutral, and compressive strain.

In one embodiment, the plurality of sections has strains alternating between a tensile strain and a compressive strain, between a tensile strain and neutral, between a compressive strain and neutral, between a first tensile strain and a second tensile strain, or between a first compressive strain and a second compressive strain.

According to one embodiment, the semiconductor layer has a length, a width, and a thickness with the length being larger than the width and the thickness being a sum of thicknesses of the plurality of sections, and wherein the thickness is significantly larger than the width of the semiconductor layer.

In one embodiment, the semiconductor structure further includes two anchor structures at two ends of the length of the semiconductor layer, directly adjacent to the plurality of sections. In another embodiment, the same chemical composition of the semiconductor layer includes silicon (Si) and the two anchor structures includes silicon-nitride (SiN).

In one embodiment, the semiconductor structure further includes a pillar layer at one side of the width of the semiconductor layer, wherein the semiconductor layer is epitaxially grown from a sidewall surface of the pillar layer. In another embodiment, the pillar layer includes a plurality of sections corresponding to the plurality of sections of the semiconductor layer, wherein the plurality of sections of the pillar layer has alternating chemical compositions between Si and silicon-germanium (SiGe).

According to another embodiment, the semiconductor structure includes a first semiconductor layer and a second semiconductor layer that are substantially identical to have a same chemical composition and plurality of sections from a top to a bottom thereof. In one embodiment, the first and second semiconductor layers are connected by a third semiconductor layer at top sections of the first and second semiconductor layers. In another embodiment, the third semiconductor layer has a same strain as that of the top sections of the first and second semiconductor layers.

Embodiments of present invention provide a method of forming a semiconductor structure such as a strained superlattice. The method includes forming a pillar layer having a plurality of sections from a top to a bottom thereof, wherein the plurality of sections of the pillar layer have different chemical compositions, and epitaxially growing a semiconductor layer on a sidewall surface of the pillar layer to have a plurality of sections from a top to a bottom thereof corresponding to the plurality of sections of the pillar layer, wherein the plurality of sections of the semiconductor layer has a same chemical composition.

In one embodiment, the plurality of sections of the pillar layer includes alternating chemical compositions between Si and SiGe, and wherein epitaxially growing the semiconductor layer includes epitaxially growing Si on the sidewall surface of the plurality of sections of the pillar layer.

The semiconductor layer has a length, a width, and a thickness with the length being larger than the width and the thickness being a sum of thicknesses of the plurality of sections of the semiconductor layer. In one embodiment, epitaxially growing the semiconductor layer includes epitaxially growing Si at the sidewall surface of the pillar layer to have a horizontal thickness equivalent to the width of the semiconductor layer.

In one embodiment, the method further includes forming two anchor structures at two ends of the length of the semiconductor layer, directly adjacent to the plurality of sections of the semiconductor layer, wherein the two anchor structures include SiN.

In another embodiment, the plurality of sections of the pillar layer includes alternating chemical compositions between two types of SiGe having two different germanium (Ge) content levels, and the semiconductor layer includes silicon (Si), and the method further includes removing the plurality of sections of the pillar layer from the semiconductor layer through a selective etching process.

BRIEF DESCRIPTION OF THE DRAWINGS

The present invention will be understood and appreciated more fully from the following detailed description of embodiments of present invention, taken in conjunction with accompanying drawings of which:

FIGS. 3A, 3B, and 3C are demonstrative illustrations of cross-sectional views of a semiconductor structure in a step, following the step illustrated in FIG. 2, of manufacturing a strained superlattice according to several embodiments of a method of present invention;

FIGS. 4A, 4B, and 4C are demonstrative illustrations of cross-sectional views of a semiconductor structure in a step, following the step illustrated in FIGS. 3A, 3B, and 3C, of manufacturing a strained superlattice according to several embodiments of a method of present invention;

FIGS. 5A, 5B, and 5C are demonstrative illustrations of several cross-sectional views of a semiconductor structure in a step, following the step illustrated in FIG. 3A, of manufacturing a strained superlattice according to one embodiment of a method of present invention;

FIGS. 6A, 6B, and 6C are demonstrative illustrations of several cross-sectional views of a semiconductor structure in a step, following the step illustrated in FIG. 5A, of manufacturing a strained superlattice according to one embodiment of a method of present invention;

FIGS. 7A, 7B, and 7C are demonstrative illustrations of several cross-sectional views of a semiconductor structure in a step, following the step illustrated in FIG. 6A, of manufacturing a strained superlattice according to one embodiment of a method of present invention;

FIGS. 8A, 8B, and 8C are demonstrative illustrations of several cross-sectional views of a semiconductor structure in a step, following the step illustrated in FIG. 7A, of manufacturing a strained superlattice according to one embodiment of a method of present invention;

Figure 1:
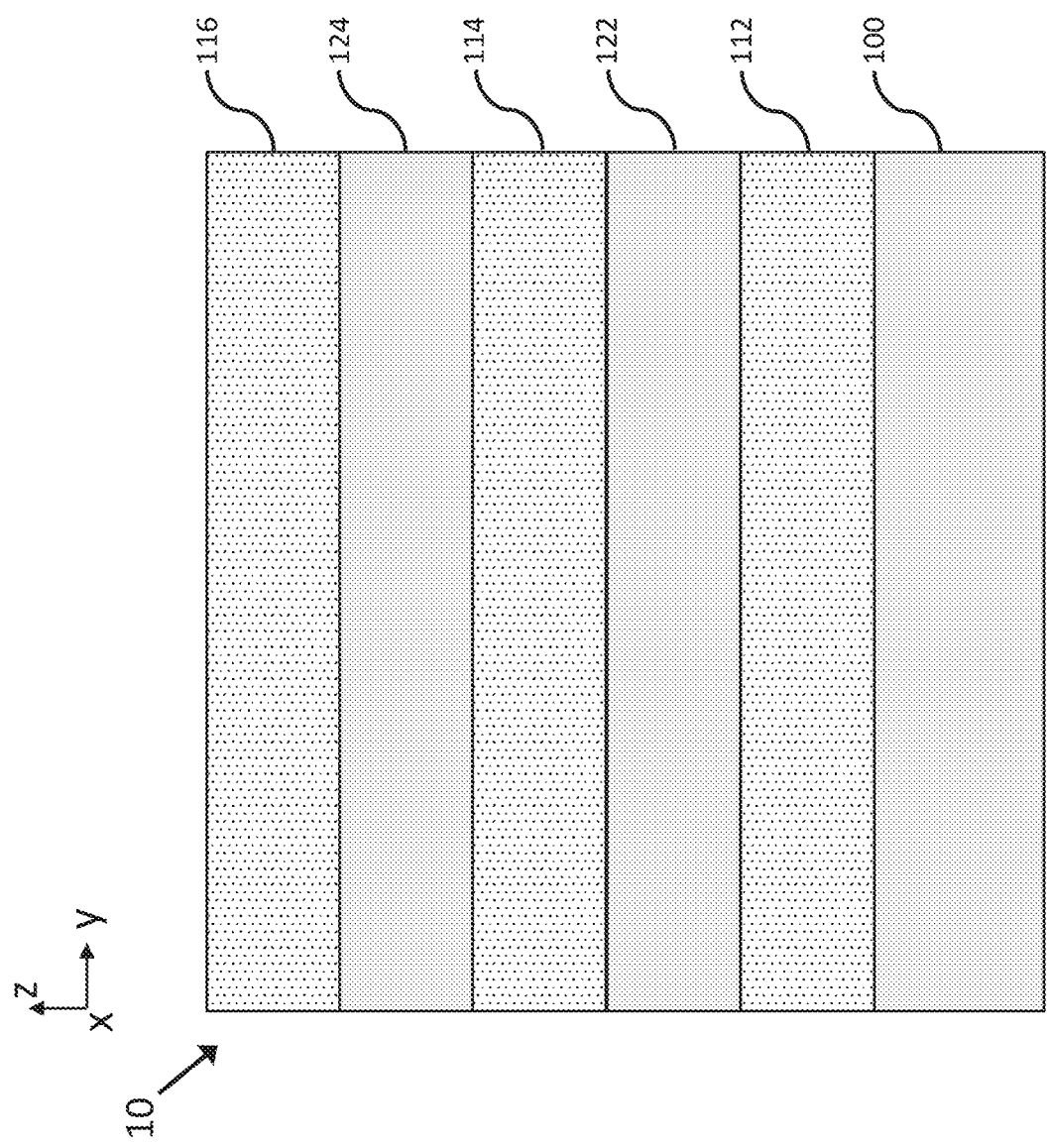
FIG. 1 is a demonstrative illustration of cross-sectional view of a semiconductor structure in a step of manufacturing a strained superlattice according to one embodiment of a method of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity or they are embodied in a single physical entity.

DETAILED DESCRIPTION OF PREFERRED EMBODIMENTS

In the below detailed description and the accompanying drawings, it is to be understood that various layers, structures, and regions shown in the drawings are both demonstrative and schematic illustrations that are not drawn to scale. In addition, for the ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures may not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to the different structural orientations of the semiconductor structures shown throughout the drawings, XYZ Cartesian coordinates may be shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

FIG. 1 is a demonstrative illustration of cross-sectional view of a semiconductor structure in a step of manufacturing a strained superlattice according to one embodiment of a method of present invention. More specifically, FIG. 1 illustrates a cross-sectional view of semiconductor structure 10 in a Y-Z plane of XYZ Cartesian coordinates.

In one embodiment, the method includes providing a semiconductor substrate 100 and forming a stack of semiconductor layers such as, for example, semiconductor layers 112, 122, 114, 124, and 116 on top thereof. Semiconductor substrate 100 may be, for example, a bulk silicon (Si) substrate, a bulk germanium (Ge) substrate, a SiGe substrate, or a silicon-on-insulator (SOI) substrate. However, embodiments of present invention are not limited in this aspect and other types of substrate may be used as well. Hereinafter from time to time, for the ease of discussion without loss of generality, substrate 100 may be described as a silicon (Si) substrate.

In one embodiment, the method includes epitaxially growing the stack of semiconductor layers 112, 122, 114, 124, and 116 on top of substrate 100. For example, semiconductor layers 112, 114, and 116 may be alternatingly formed on top of substrate 100 and semiconductor layers 122 and 124. In one embodiment, semiconductor layers 112, 114, and 116 may have a common thickness and may include one semiconductor material to have one chemical composition. Alternatively, semiconductor layers 112, 114, and 116 may have different thicknesses and may include one semiconductor material to have one chemical composition. Semiconductor layers 122 and 124 may have another common thickness, which may be the same or different from that of semiconductor layers 112, 114, and 116, and may include another semiconductor material to have another chemical composition, which is different from that of semiconductor layers 112, 114, and 116. Alternatively, semiconductor layers 122 and 124 may have different thicknesses. For example, in one embodiment, semiconductor layers 112, 114, and 116 may include epitaxially grown silicon-germanium (SiGe) with, e.g., about 25% by atomic (atomic) Ge content level and semiconductor layers 122 and 124 may include epitaxially grown Si with no Ge content. In other words, semiconductor structure 10 may include a stack of alternating SiGe layers and Si layers formed on top of Si substrate 100. In another embodiment, semiconductor layers 112, 114, and 116 may include a first epitaxially grown SiGe with, e.g., about 25% (atomic) Ge content level and semiconductor layers 122 and 124 may include a second epitaxially grown SiGe with, e.g., 50% (atomic) Ge content level. In other words, semiconductor structure 10 may include a stack of SiGe layers with two Ge content levels, e.g., 25% and 50%, arranged in an alternating fashion.

Other materials that may be suitable for forming semiconductor layers 112, 114, and 116, and semiconductor layers 122 and 124 may include, but are not limited to, SiGe/Si:C, Si/Si:C, various III-V compounds, and II-V compounds, to name a few.

Here, it is to be noted that embodiments of present invention are not limited in the above aspect. For example, semiconductor layers 112, 114, and 116 may not always include the same material and in one embodiment different layers may include different materials or have different chemical compositions. Similarly, semiconductor layers 122 and 124 may not always include the same material either and in one embodiment different layers may include different materials or have different chemical compositions. In one embodiment, any two neighboring layers may include different materials or have different chemical compositions. In general, materials of different chemical compositions have different lattice constants.

Hereinafter and from time to time, for the ease of discussion without loss of generality, unless otherwise specifically noted, semiconductor layers 112, 114, and 116 may be described as SiGe layers and semiconductor layers 122 and 124 may be described as Si layers. When SiGe layers 112, 114, and 116 are epitaxially grown on Si substrate 100 and Si layers 122 and 124, because relaxed SiGe generally has larger lattice constant than relaxed Si, in-plane (in the X-direction (in-out paper direction) and Y-direction) compressive strain may be created in epitaxially grown SiGe layers 112, 114, and 116 to match the lattice constant of silicon substrate. Correspondingly, the out-plane (in the Z-direction) lattice constant of SiGe in the SiGe layers 112, 114, and 116 may be enlarged, resulting in tensile strain in the out-plane (in the Z-direction).

Figure 2:
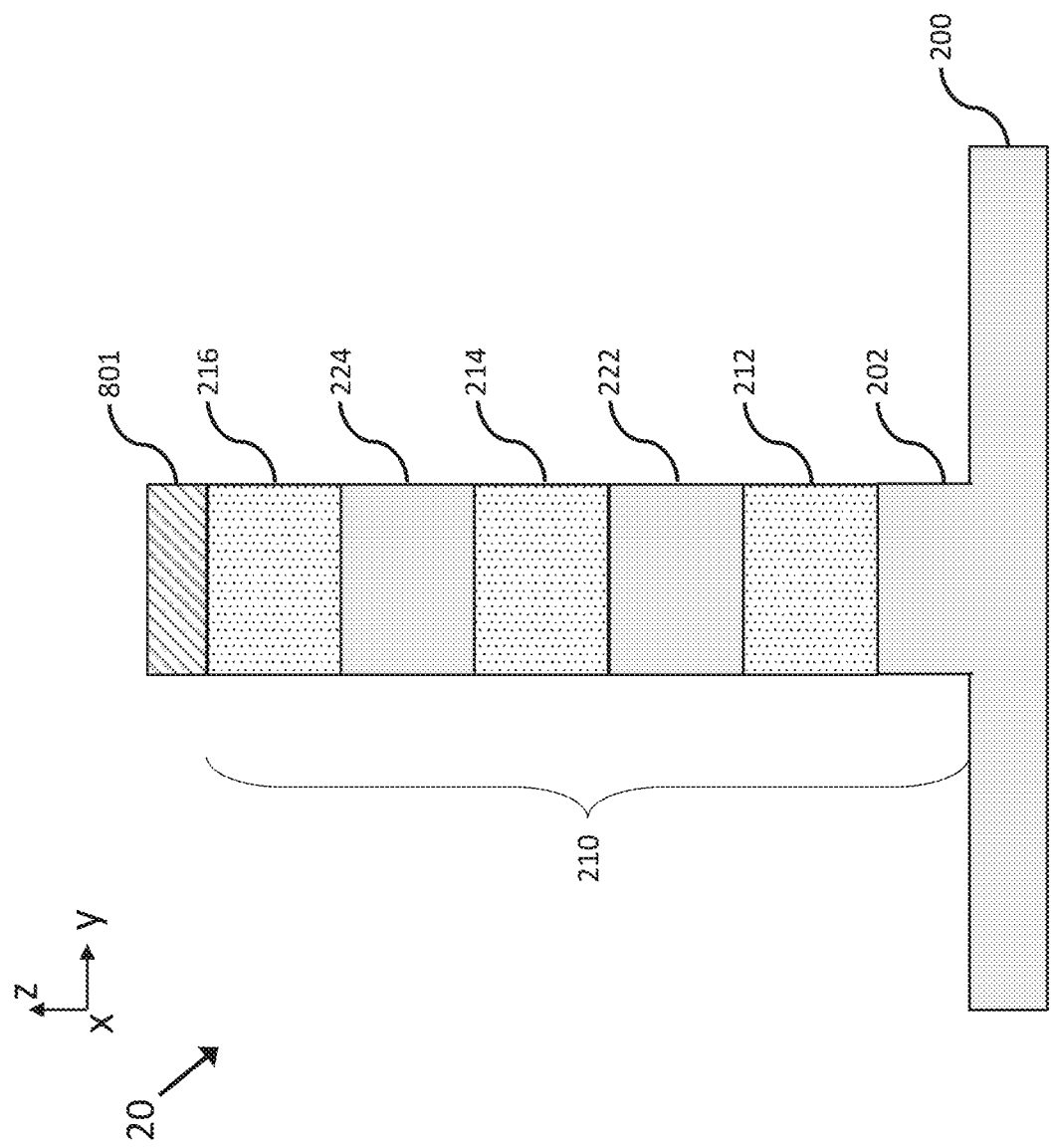
FIG. 2 is a demonstrative illustration of cross-sectional view of a semiconductor structure in a step, following the step illustrated in FIG. 1, of manufacturing a strained superlattice according to one embodiment of a method of present invention.

FIG. 2 is a demonstrative illustration of cross-sectional view of a semiconductor structure in a step, following the step illustrated in FIG. 1, of manufacturing a strained superlattice according to one embodiment of a method of present invention. More specifically, FIG. 2 illustrates a cross-sectional view of semiconductor structure 20 in a Y-Z plane of XYZ Cartesian coordinates.

In one embodiment, the method includes patterning the stack of semiconductor layers 112, 122, 114, 124, and 116 and a portion of substrate 100 into a vertical semiconductor pillar layer 210 as illustrated in FIG. 2. Vertical semiconductor pillar layer 210 may also be referred to as a vertical pillar layer or simply a pillar layer. More specifically, the method includes forming a hard mask 801 on top of the stack of semiconductor layers through a lithographic patterning process or any other suitable patterning techniques such as double patterning, quadruple patterning, and etching away portions of semiconductor layers 112, 122, 114, 124, and 116 that are not covered by hard mask 801, and a portion of substrate 100, to create a pillar layer 210. As being illustrated in FIG. 2, pillar layer 210 may include a plurality of sections including sections 212, 214, and 216, sections 222 and 224, and a substrate portion 202. In one embodiment, sections 212, 214, and 216 may be SiGe layers and sections 222 and 224 may be Si layers. Sections 212, 214, and 216 may be alternatingly formed on top of substrate portion 202 and sections 222 and 224. In other words, the method includes forming a pillar layer 210 that includes alternating SiGe/Si layers covered by hard mask 801. Due to elastic edge strain relaxation, along the in-plane direction (Y-direction), the originally compressively strained SiGe layers 212, 214, and 216, partially relax, stretching the adjacent Si layers. As a result, along Y direction, the SiGe layers is still compressively strained (although less strain than the original strain before patterning) and the adjacent Si layers are partially tensily strained. Based on basic stress-strain relation (Poisson's ratio), the out-plane (Z-direction), using the relaxed Si as the reference, the SiGe pillar has a larger lattice constant and the Si pillar has a smaller lattice constant.

Figure 3A:
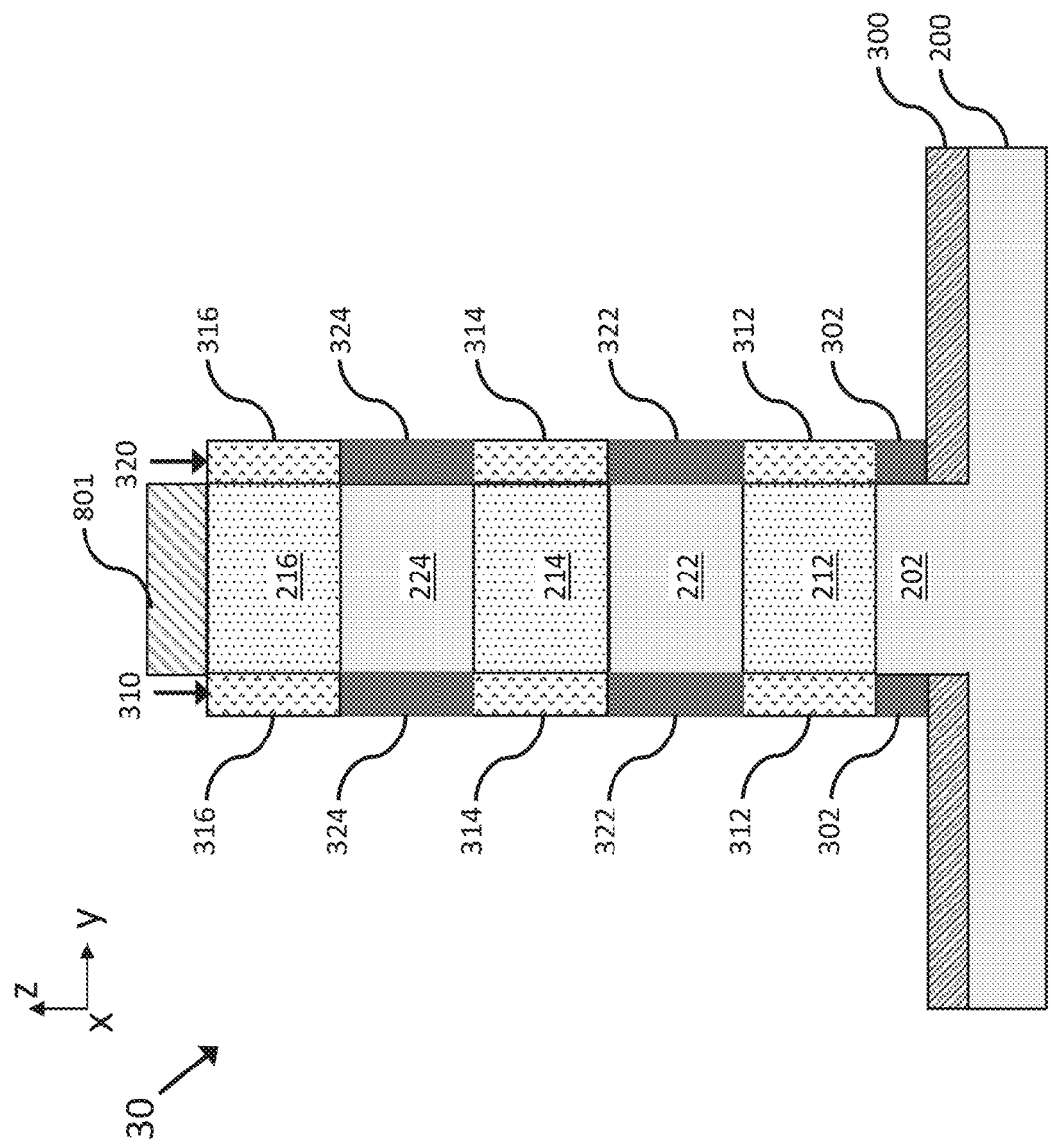

FIGS. 3A, 3B, and 3C are demonstrative illustrations of cross-sectional views of a semiconductor structure in a step, following the step illustrated in FIG. 2, of manufacturing a strained superlattice according to several embodiments of a method of present invention. More specifically, FIGS. 3A, 3B, and 3C illustrate cross-sectional views of semiconductor structures 30, 32, and 34 respectively in a Y-Z plane of XYZ Cartesian coordinates.

In one embodiment, the method includes forming a dielectric layer 300 at the bottom of pillar layer 210 by a deposition process. For example, dielectric layer 300 may be deposited on a top surface of a substrate portion 200 of Si substrate 100. In one embodiment, dielectric layer 300 may be an oxide or nitride layer and may be formed to isolate substrate portion 200 from rest of semiconductor structures to be formed thereupon. Hereinafter from time to time, for the ease of discussion without loss of generality, dielectric layer 300 may be described as an oxide layer.

Following the formation of dielectric layer 300, in one embodiment, the method includes forming first and second vertical semiconductor layers 310 and 320 on sidewall surfaces of pillar layer 210, or at least forming a first vertical semiconductor layer 310 on a sidewall surface of pillar layer 210. Vertical semiconductor layer 310 (and 320) may also be referred to as simply as semiconductor layer 310 (and 320).

As is illustrated in FIGS. 3A, 3B, and 3C, semiconductor layers 310 and 320 may include substantially identical structures and chemical compositions. More specifically, in forming semiconductor layer 310 (and 320), the method may include epitaxially growing a Si layer on sidewall surfaces of SiGe layers 212, 214, and 216, on sidewall surfaces of Si layers 222, 224, and on sidewall surfaces of Si substrate portion 202. As a result, semiconductor layer 310 (and 320) may include, from a top to a bottom thereof, a plurality of sections including sections 316, 324, 314, 322, 312, and 302. The plurality of sections may have a same chemical composition such as, for example, Si, and different strains which are described below in more details.

During epitaxial growth, epitaxially formed Si layer 310 (and 320) may attempt to match lattice constants at the sidewalls of pillar layer 210 of alternating SiGe/Si layers. Along the Z-direction of pillar layer 210, SiGe layers 212, 214, and 216 and Si layers 222 and 224 of pillar layer 210 have different lattice constants. As a result, epitaxially formed Si layer 310 (and 320) may have two different lattice constants along the Z-direction depending upon from where the Si layer is epitaxially formed. For example, a section of semiconductor layer 310 (and 320) that is epitaxially grown from a SiGe section of pillar layer 210 may have a lattice constant that largely matches or, in some instances, substantially matches that of the SiGe section of pillar layer 210. On the other hand, a section of semiconductor layer 310 that is epitaxially grown from a Si section of pillar layer 210 may have a lattice constant that largely matches or, in some instances, substantially matches that of the Si section of pillar layer 210. Since SiGe generally has a larger lattice constant than that of Si, sections of semiconductor layer 310 (and 320) that epitaxially grown from the SiGe sections of pillar layer 210 have a lattice constant larger than that of relaxed Si resulting in tensile strains in the semiconductor layer 310 (and 320). On the other hand, sections of semiconductor layer 310 (and 320) that epitaxially grown from the Si sections of pillar layer 210 have a lattice constant smaller than that of relaxed Si, resulting in compressive strains in the semiconductor layer 310 (and 320).

It is to be noted here that, in another embodiment, when pillar layer 210 includes a plurality of sections of different materials having lattice constants that are different from, for example, those of the alternating SiGe/Si layers as discussed above, semiconductor layer 310 (and 320) may include a plurality of sections that have different strains from those discussed above as well. Furthermore, the difference in strain may include, for example, the strength, the type of strain, or a combination of both the strength and the type of strain. The type of strain may include a tensile strain and a compressive strain, and for the discussion hereinafter neutral (no strain) is also considered as a type of strain. In other words, the type of strain may include a tensile strain, neutral, and a compressive strain.

For example, when pillar layer 210 includes a plurality of sections of alternating SiGe layers with two or more different Ge content levels, epitaxial Si layer 310 (and 320) formed at the sidewall surface of pillar layer 210 may include different strains that are all tensile strains and different only in their strength. Further for example, when pillar layer 210 includes, for example, one or more sections of relaxed Si layers instead of strained Si layers (in addition to SiGe layers), sections of epitaxial Si layer 310 (and 320) corresponding to the sections of relaxed Si of pillar layer 210 may be neutral in strain, containing neither tensile nor compressive strains. Here, neutral is considered as a type of strain (with the strength equaling to zero) in the context of description of present invention. Other materials that may be epitaxially grown on sidewall surfaces of pillar layer 210, to form semiconductor layers 310 and 320, may include, but are not limited to SiGe, Si:C, III-V compounds, and II-V compounds.

Depending upon the type of materials used for pillar layer 210 and epitaxially grown semiconductor layers 310 and 320 on sidewalls of pillar layer 210, semiconductor layers 310 and 320 may include a plurality of sections that have two alternating strains. For example, the two alternating strains may be, for example, both tensile but different in strength, both compressive but different in strength, one tensile and one compressive, one tensile and one neutral, or one compressive and one neutral. The plurality of sections of semiconductor layers 310 and 320 may have a same thickness resulting a periodic strain variation. Alternatively, the plurality of sections of semiconductor layers 310 and 320 may have a non-uniform thickness variation corresponding to that of the pillar layer 210.

In the embodiment illustrated in FIG. 3A, pillar layer 210 may be covered by hard mask 801. Hard mask 801, which may be silicon-nitride (SiN) for example, prevents epitaxial growth of Si on top thereof. In other words, FIG. 3A illustrates an embodiment of present invention where epitaxial Si layer are formed only on sidewall surfaces of pillar layer 210. However, embodiments of present invention are not limited in this aspect. For example, as being demonstratively illustrated in FIGS. 3B and 3C, before performing epitaxial growth of Si layers 310 and 320, hard mask 801 may be removed to expose a top surface of pillar layer 210. As a result, epitaxial Si layer may be formed on top of pillar layer 210 in a subsequent step.

For example, FIG. 3B illustrates an embodiment wherein hard mask 801 is removed to expose a top section of section 216 of pillar layer 210. Section 216 is a SiGe layer and the embodiment provides a semiconductor layer 330 by epitaxially growing a Si layer from section 216 of SiGe layer. Semiconductor layer 330 connects or bridges semiconductor layers 310 and 320 to form a composite semiconductor layer (including semiconductor layers 310, 320 and 330) that has an inverted U-shape. Here, semiconductor layer 330 of epitaxial Si may have a lattice constant that largely or substantially matches that of underneath section 216 of SiGe.

Further for example, FIG. 3C illustrates an embodiment wherein hard mask 801 is removed to expose a top section of section 224 of pillar layer 210. Section 224 is a Si layer and the embodiment provides a semiconductor layer 330 by epitaxially growing a Si layer from section 224 of Si layer. Semiconductor layer 330 connects or bridges semiconductor layers 310 and 320 to form a composite semiconductor layer (including semiconductor layers 310, 340, and 330) that has an inverted U-shape. Here, semiconductor layer 330 of epitaxial Si may have a lattice constant that largely or substantially matches that of underneath section 214 of Si.

Figure 4A:
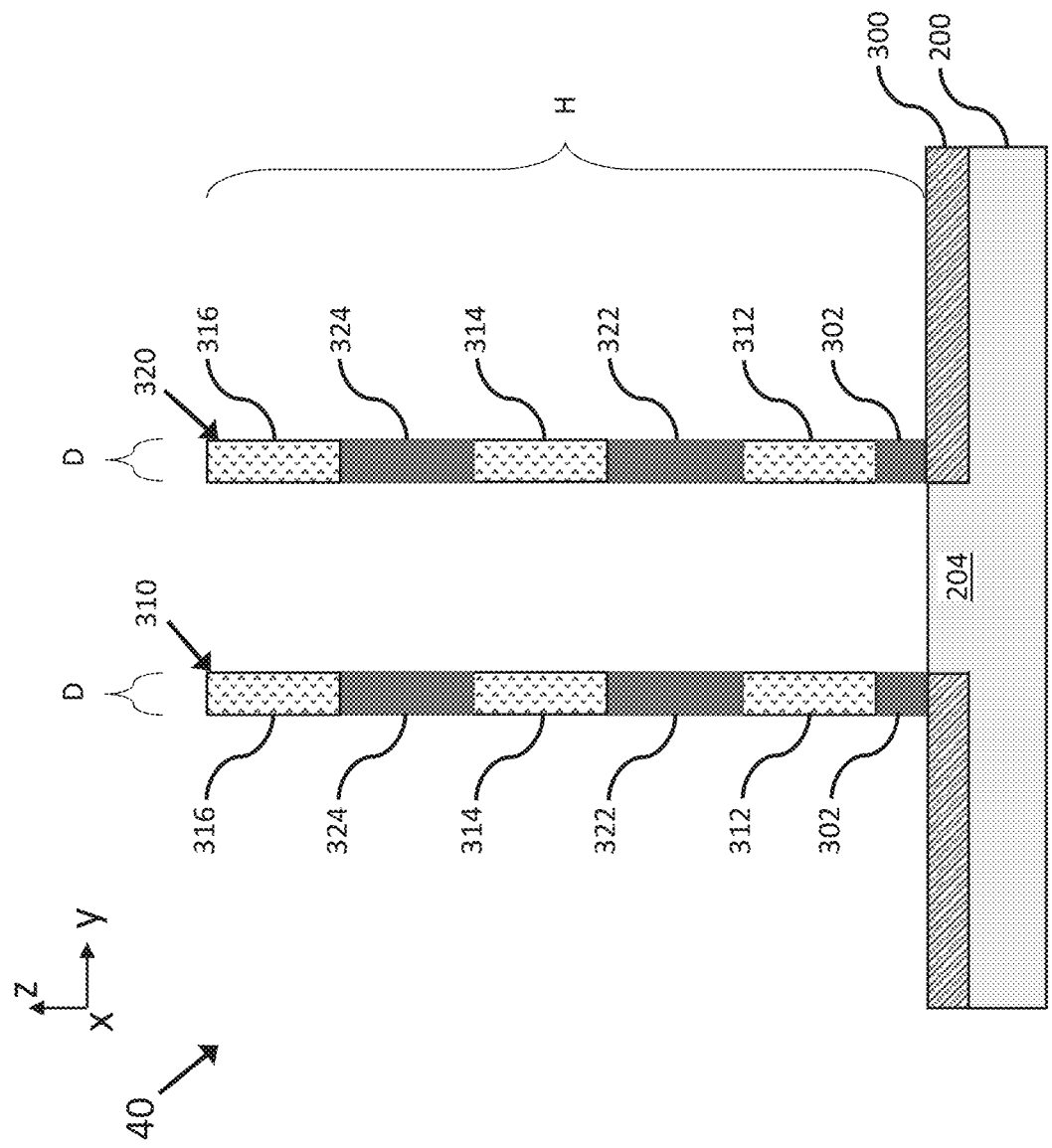

FIGS. 4A, 4B, and 4C are demonstrative illustrations of cross-sectional views of a semiconductor structure in a step, following the step illustrated in FIGS. 3A, 3B, and 3C, of manufacturing a strained superlattice according to several embodiments of a method of present invention. More specifically, FIGS. 4A, 4B, and 4C illustrate cross-sectional views of semiconductor structures 40, 42, and 44 respectively in a Y-Z plane of XYZ Cartesian coordinates.

More specifically and in one embodiment, FIG. 4A illustrates first and second semiconductor layers 310 and 320 after pillar layer 210 is removed through a selective etching process. Semiconductor layer 310 (and 320) may include a plurality of sections 302, 312, 322, 314, 324, and 316 stacked in a height direction, and may have a width D, a thickness H and a length L (see FIG. 6A). Thickness H of semiconductor layer 310 (and 320) equals a sum of thicknesses of the plurality of sections 302, 312, 322, 314, 324, and 316. Also, thickness H of semiconductor layer 310 (and 320) is significantly larger than width D of semiconductor layer 310 (and 320). Moreover, length L of semiconductor layer 310 may be larger than width D.

Pillar layer 210 may be removed through, for example, a selective etching process. In one embodiment, pillar layer 210 may include a plurality of sections 212, 222, 214, 224, and 216 of SiGe layers with different Ge content levels. For example, SiGe layers 212, 214, and 216 may have a first Ge content level such as, for example, 25% (atomic) Ge and SiGe layers 222 and 224 may have a second Ge content level such as, for example, 50% (atomic) Ge. A selective etching process may be applied that generally etches semiconductor layers with Ge content more aggressively than that of a pure Si layer such as semiconductor layers 310 and 320. Therefore, according to embodiments of present invention, SiGe layers 212, 214, and 216 and SiGe layers 222 and 224 of pillar layer 210 may be selectively etched away, leaving Si semiconductor layers 310 and 320 standing on top of oxide layer 300 above substrate portion 200, as being demonstratively illustrated in FIG. 4A. In one embodiment a portion of substrate portion 202 may be removed or recessed resulting in a substrate portion 204.

Similarly, FIGS. 4B and 4C illustrates cross-sectional view of semiconductor structures 42 and 44 following the step illustrated in FIGS. 3B and 3C after pillar layer 210 is selectively removed from sidewalls of semiconductor layers 310 and 320, and from underneath semiconductor layer 330 that connects semiconductor layers 310 and 320. In one embodiment a portion of substrate portion 202 may be removed or recessed resulting in a substrate portion 204.

FIGS. 5A, 5B, and 5C are demonstrative illustrations of several cross-sectional views of a semiconductor structure in a step, following the step illustrated in FIG. 3A, of manufacturing a strained superlattice according to one embodiment of a method of present invention. More specifically, FIG. 5A illustrates a cross-sectional view of semiconductor structure 50 in a Y-Z plane along the A5-A5 line as indicated in FIG. 5B, FIG. 5B illustrates a top view of semiconductor structure 50, and FIG. 5C illustrates a horizontal cross-sectional view of semiconductor structure 50 in a X-Y plane along the C5-C5 line as indicated in FIG. 5A.

In one embodiment, anchor structures may be formed to provide mechanical support to semiconductor layers 310 and 320, which have substantially thin width, before vertical pillar layer 210 is removed. To form anchor structures, embodiment of present invention provides a method that includes forming a dielectric layer on top of semiconductor structure 30. In one embodiment, the method includes depositing on top of dielectric layer 300 a dielectric layer 502. Dielectric layer 502 may be an oxide layer, a silicon-nitride (SiN) layer, an inter-level-dielectric (ILD) layer, or any other suitable materials and may be the same or different material from dielectric layer 300. Dielectric layer 502 may be deposited to have a thickness at least equal to or larger than the thickness of semiconductor layers 310 and 320. In the embodiment illustrated in FIG. 3A, dielectric layer 502 may be formed to have a thickness to be at least above hard mask 801. The method further includes planarizing dielectric layer 502 using for example, a chemical-mechanic-polishing (CMP) process, to expose hard mask 801, and in the embodiments illustrated in FIGS. 3B and 3C to expose semiconductor layer 330 on top of pillar layer 210.

FIGS. 6A, 6B, and 6C are demonstrative illustrations of several cross-sectional views of a semiconductor structure in a step, following the step illustrated in FIG. 5A, of manufacturing a strained superlattice according to one embodiment of a method of present invention. More specifically, FIG. 6A illustrates a cross-sectional view of semiconductor structure 60 in a X-Z plane along the A6-A6 line as indicated in FIG. 6C, FIG. 6B illustrates a top view of semiconductor structure 60, and FIG. 6C illustrates a cross-sectional view of semiconductor structure 60 in a Y-Z plane along the C6-C6 line as indicated in FIG. 6B.

In one embodiment, the method includes forming trenches at the two longitudinal ends of semiconductor layers 310 and 320. As illustrated in FIG. 6A, semiconductor layers 310 and 320 have a length L and in one embodiment the length L is larger than the width D (see FIG. 4A). The method includes subsequently filling the trenches with dielectric materials to form anchor structures 602. More specifically, the trenches may be made substantially vertical into dielectric layer 502, through a patterning and etching process, and may be made sufficiently deep to expose most of end portions of the plurality of sections of semiconductor layers 310 and 320. In one embodiment, the trenches may be made into dielectric layer 300 below the level of semiconductor layers 310 and 320. Dielectric materials that fill the trenches to make for anchor structures 602 may include, for example, oxide (SiO), silicon-nitride (SiN), oxynitride (SiON), and other suitable dielectric materials.

FIGS. 7A, 7B, and 7C are demonstrative illustrations of several cross-sectional views of a semiconductor structure in a step, following the step illustrated in FIG. 6A, of manufacturing a strained superlattice according to one embodiment of a method of present invention. More specifically, FIG. 7A illustrates a cross-sectional view of semiconductor structure 70 in a Y-Z plane along the A7-A7 line as indicated in FIG. 7C, FIG. 7B illustrates a top view of semiconductor structure 70, and FIG. 7C illustrates a cross-sectional view of semiconductor structure 70 in a X-Z plane along the C7-C7 line as indicated in FIG. 7A.

In one embodiment, following the formation of anchor structures 602, the method includes removing pillar layer 210 selectively from between semiconductor layers 310 and 320. Pillar layer 210 may include alternating layers of, for example, SiGe/Si, SiGe/Si:C, Si/Si:C, III-V compounds, and/or II-V compounds while semiconductor layers 310 and 320 may include Si, SiGe, Si:C, III-V compounds, and/or II-V compounds. Generally, pillar layer 210 may include materials, either one or both of the alternating layers, that have different chemical compositions from that of semiconductor layers 310 and 320. Based upon difference in material properties, pillar layer 210 may be selectively etched away from semiconductor layers 310 and 320. For example, SiGe layers, with different Ge content levels as part of pillar layer 210, may be selectively removed or etched away from pure Si layer which is epitaxially formed on the pillar layer 210 as semiconductor layers 310 and 320.

FIGS. 8A, 8B, and 8C are demonstrative illustrations of several cross-sectional views of a semiconductor structure in a step, following the step illustrated in FIG. 7A, of manufacturing a strained superlattice according to one embodiment of a method of present invention. More specifically, FIG. 8A illustrates a cross-sectional view of semiconductor structure 80 in a Y-Z plane along the A8-A8 line as indicated in FIG. 8C, FIG. 8B illustrates a top view of semiconductor structure 80, and FIG. 8C illustrates a cross-sectional view of semiconductor structure 80 in a X-Z plane along the C8-C8 line as indicated in FIG. 8A.

In one embodiment, the method includes removing planarizing layer 502, after the removal of pillar layer 210, to expose sidewall surfaces of semiconductor layers 310 and 320. underneath oxide layer 300. Semiconductor layers 310 and 320 may be mechanically supported by anchor structures 602, as being illustrated in FIGS. 8B and 8C. In one embodiment, anchor structures 602 also help maintain strains of the plurality of sections of semiconductor layers 310 and 320.

Here, it is to be noted that FIGS. 5A, 6A, 7A, and 8A corresponds to an embodiment illustrated in FIG. 3A where hard mask 801, which remains on top of pillar layer 210 in FIG. 3A, prevented the formation of a connecting or bridging semiconductor layer. Anchor structures 602 may be formed similarly for other embodiments such as embodiments illustrated in FIGS. 3B and 3C. Manufacturing of anchor structures for these embodiments may follow a similar process as that for embodiment illustrated in FIG. 3A and thus are not repeated here.

Figure 9:
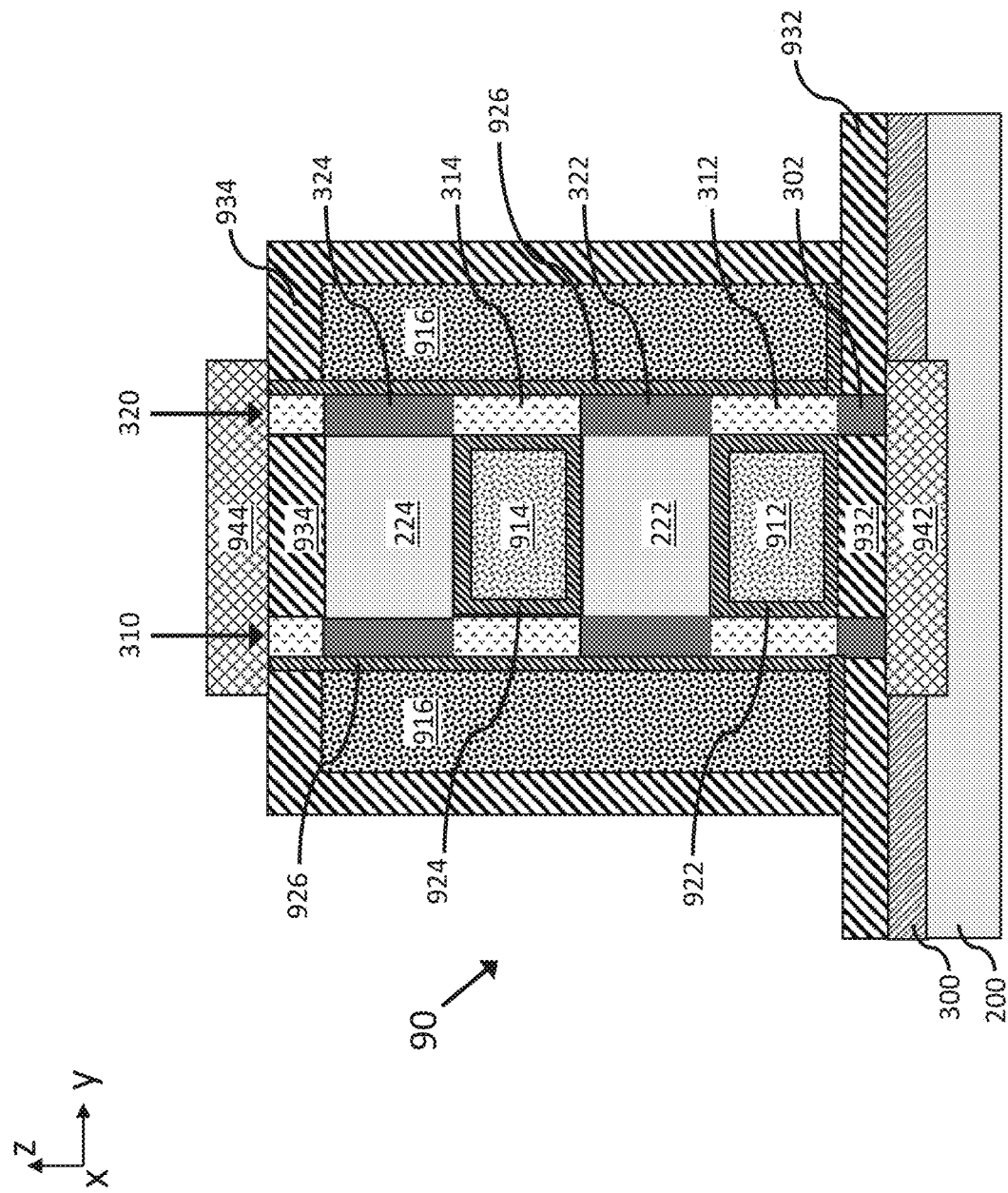
FIG. 9 is demonstrative illustration of a cross-sectional view of a semiconductor device with strained superlattice according to one embodiment of present invention.

FIG. 9 is demonstrative illustration of a cross-sectional view of a semiconductor device 90 with strained superlattice according to one embodiment of present invention. In particular, embodiments of present invention include applying semiconductor layers 310 and 320, which are strained superlattice demonstratively illustrated in FIG. 9 to include a plurality of sections 302, 312, 322, 314, and 324 of two alternating strains, in making semiconductor devices such as a vertical FET (VFET) 90.

More specifically, vertical FET 90 may include a bottom source/drain (S/D) region 942, a top S/D region 944, a plurality of inner gates such as inner gates 912 and 914, and an outer gate 916 that surrounds outer sidewalls of semiconductor layers 310 and 320. In addition, a bottom spacer 932 may be formed between bottom S/D region 942 and both inner gate 912 and outer gate 916, and a top spacer 934 may be formed between top S/D region 944 and outer gate 916. Inner gate 912 may cover strained section 312 of semiconductor layers 310 and 320 (strained superlattice) via a gate dielectric layer 922, inner gate 914 may cover strained section 314 of semiconductor layers 310 and 320 (strained superlattice) via a gate dielectric layer 924, and outer gate 916 may cover the outer sidewalls of semiconductor layers 310 and 320 (strained superlattice) via a gate dielectric layer 926. Additionally, gate dielectric layers 922 and 924 may be formed covering surfaces of sections 222 and 224 of pillar layer 210, in which case sections 222 and 224 may be Si layers.

Figure 10:
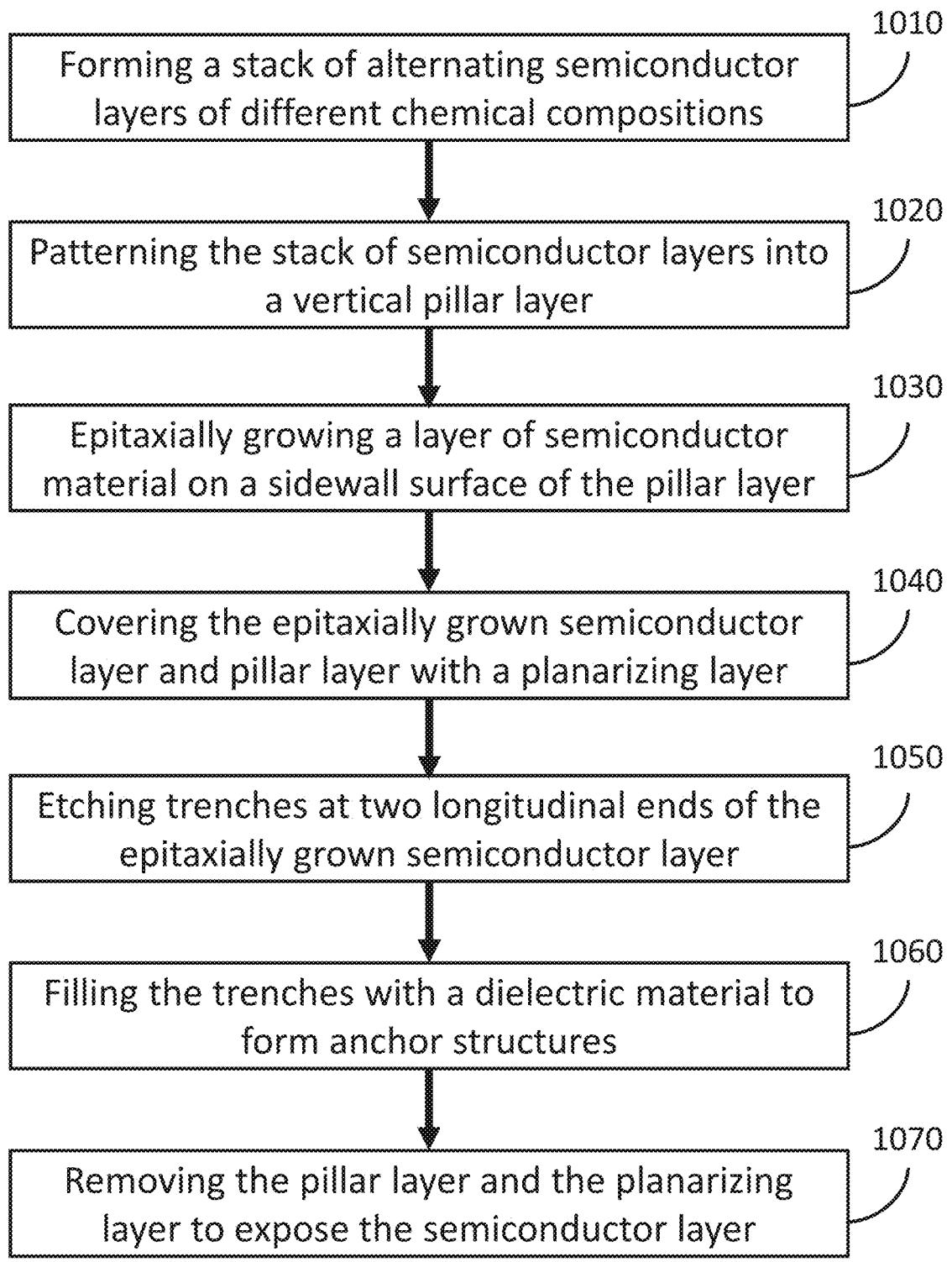
FIG. 10 is a demonstrative illustration of a flow-chart of a method of manufacturing a strained superlattice according to embodiments of present invention.

FIG. 10 is a demonstrative illustration of a flow-chart of a method of manufacturing a strained superlattice according to embodiments of present invention. The method includes (1010) forming a stack of semiconductor layers of different materials having different chemical compositions. By having different chemical compositions, the stack of semiconductor layers has different lattice constants. The method includes (1020) patterning the stack of semiconductor layers into a vertical pillar layer. Patterning the stack of semiconductor layers may be made through, for example, a lithographic patterning and etching process. The method includes (1030) epitaxially growing a semiconductor material on sidewall surfaces of the pillar layer. In one embodiment when a hard mask used in the patterning of the pillar layer is removed from the top surface of the pillar layer, the semiconductor material may be epitaxially grown on the top surface of the pillar layer as well. The epitaxially grown semiconductor material forms vertical semiconductor layers at sidewalls of the pillar layer. The vertical semiconductor layers may have a plurality of sections corresponding to the stack of semiconductor layers of the pillar layer. The plurality of sections of the vertical semiconductor layer has a same chemical composition, which may be at least partially different from that of the pillar layer, and different strains. The difference in strains may include difference in strength, in type such as a tensile strain or a compressive strain or a neutral state, or in a combination of both strength and type.

Embodiments of present invention may further include forming anchor structures to provide mechanical support to and retain strains in the epitaxially formed semiconductor layers. More specifically, the method includes (1040) forming a planarizing layer to cover the epitaxially grown semiconductor layer and the pillar layer, and subsequently includes (1050) etching or forming one or more trenches in the planarizing layer at the two longitudinal ends of the epitaxially grown semiconductor layer. The method further includes (1060) filling the trenches with dielectric materials to form anchor structures. The anchor structures may be directly adjacent to the epitaxially grown vertical semiconductor layers thereby both providing mechanical support and causing the semiconductor layers to retain strains after the pillar layer is removed. The method then includes (1070) removing the pillar layer and the planarizing layer to expose the epitaxially grown vertical semiconductor layers.

It is to be understood that the exemplary methods discussed herein for fabricating or manufacturing strained superlattice may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

It is to be understood that the various layers, structures, and/or regions described above are not necessarily drawn to scale. In addition, for ease of explanation one or more layers, structures, and regions of a type commonly used to form semiconductor devices or structures may not be explicitly shown in a given illustration or drawing. This does not imply that any layers, structures, and regions not explicitly shown are omitted from the actual semiconductor structures.

Furthermore, it is to be understood that the embodiments discussed herein are not limited to the particular processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Terms such as "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Also, in the figures, the illustrated scale of one layer, structure, and/or region relative to another layer, structure, and/or region is not necessarily intended to represent actual scale.

Semiconductor devices and methods for forming same in accordance with the above-described techniques can be employed in various applications, hardware, and/or electronic systems, including but not limited to personal computers, communication networks, electronic commerce systems, portable communications devices (e.g., cell and smart phones), solid-state media storage devices, functional circuitry, etc. Given the teachings provided herein, one of ordinary skill in the art will be able to contemplate other implementations and applications of embodiments of the invention.

In some embodiments, the above-described techniques are used in connection with manufacture of semiconductor integrated circuit devices that illustratively include, by way of non-limiting example, CMOS devices, MOSFET devices, and/or FinFET devices, and/or other types of semiconductor integrated circuit devices that incorporate or otherwise utilize CMOS, MOSFET, and/or FinFET technology.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher level carrier) or in a multichip package (such as a ceramic carrier that has either or both surface interconnections or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While certain features of the invention have been illustrated and described herein, many modifications, substitutions, changes, and equivalents will now occur to those of ordinary skill in the art. Such changes, modification, and/or alternative embodiments may be made without departing from the spirit of present invention and are hereby all considered within the scope of present invention. It is, therefore, to be understood that the appended claims are intended to cover all such modifications and changes as fall within the spirit of the invention.

What is claimed is:

1. A semiconductor structure comprising:
   a semiconductor layer having a plurality of sections from a top to a bottom thereof, wherein the plurality of sections have a same chemical composition and at least two different strains, and
   one or more inner gates and an outer gate of a vertical transistor, wherein the one or more inner gates cover inner sidewalls of one or more sections of the plurality of sections of the semiconductor layer, and the outer gate covers an outer sidewall of the semiconductor layer.

2. The semiconductor structure of claim 1, wherein strains between two neighboring sections of the plurality of sections differ in strength, type of strain, or a combination of strength and type of strain, wherein the type of strain includes tensile strain, neutral, and compressive strain.

3. The semiconductor structure of claim 1, wherein the plurality of sections have strains alternating between a tensile strain and a compressive strain, between a tensile strain and neutral, between a compressive strain and neutral, between a first tensile strain and a second tensile strain, or between a first compressive strain and a second compressive strain.

4. The semiconductor structure of claim 1, wherein the semiconductor layer has a length, a width, and a thickness with the length being larger than the width and the thickness being a sum of thicknesses of the plurality of sections, and wherein the thickness is significantly larger than the width of the semiconductor layer.

5. The semiconductor structure of claim 4, further comprising two anchor structures at two ends of the length of the semiconductor layer, directly adjacent to the plurality of sections.

6. The semiconductor structure of claim 5, wherein the same chemical composition comprises silicon (Si) and the two anchor structures comprise silicon-nitride (SiN).

7. The semiconductor structure of claim 4, further comprising a pillar layer at one side of the width of the semiconductor layer, wherein the semiconductor layer is epitaxially grown from a sidewall surface of the pillar layer.

8. The semiconductor structure of claim 7, wherein the pillar layer comprises a plurality of sections corresponding to the plurality of sections of the semiconductor layer, wherein the plurality of sections of the pillar layer has have alternating chemical compositions between silicon (Si) and silicon-germanium (SiGe).

9. A method of forming a semiconductor structure comprising:
   forming a pillar layer having a plurality of sections from a top to a bottom thereof, wherein the plurality of sections of the pillar layer have different chemical compositions;
   epitaxially growing a semiconductor layer on a sidewall surface of the pillar layer to have a plurality of sections from a top to a bottom thereof corresponding to the plurality of sections of the pillar layer, wherein the plurality of sections of the semiconductor layer have a same chemical composition, wherein the plurality of sections of the pillar layer comprise alternating chemical compositions between two types of silicon-germanium (SiGe) having two different germanium (Ge) content levels, and the semiconductor layer comprises silicon (Si); and
   removing the plurality of sections of the pillar layer from the semiconductor layer through a selective etching process.

10. The method of claim 9, wherein the plurality of sections of the pillar layer comprise alternating chemical compositions between silicon (Si) and silicon-germanium (SiGe), and wherein epitaxially growing the semiconductor layer comprises epitaxially growing Si on the sidewall surface of the plurality of sections of the pillar layer.

11. The method of claim 9, wherein the semiconductor layer has a length, a width, and a thickness with the length being larger than the width and the thickness being a sum of thicknesses of the plurality of sections of the semiconductor layer, and wherein epitaxially growing the semiconductor layer comprises epitaxially growing Si at the sidewall surface of the pillar layer to have a horizontal thickness equivalent to the width of the semiconductor layer.

12. The method of claim 11, further comprising forming two anchor structures at two ends of the length of the semiconductor layer, directly adjacent to the plurality of sections of the semiconductor layer, wherein the two anchor structures comprise silicon-nitride (SiN).

13. A semiconductor structure comprising:
a semiconductor layer having a plurality of sections from a top to a bottom thereof, wherein the plurality of sections have a same chemical composition and alternating strains,
wherein the semiconductor layer has a length, a width, and a thickness with the length being larger than the width and the thickness being a sum of thicknesses of the plurality of sections, and wherein the thickness is significantly larger than the width of the semiconductor layer, and the semiconductor structure further includes two anchor structures at two ends of the length of the semiconductor layer, directly adjacent to the plurality of sections.

14. The semiconductor structure of claim 13, wherein the alternating strains comprises a tensile strain and a compressive strain.

15. The semiconductor structure of claim 13, wherein the same chemical composition comprises silicon (Si) and the two anchor structures comprise silicon-nitride (SiN).

\* \* \* \* \*